United States Patent [19]
Antipov

[11] 4,238,278
[45] Dec. 9, 1980

[54] POLYCRYSTALLINE SILICON OXIDATION METHOD FOR MAKING SHALLOW AND DEEP ISOLATION TRENCHES

[75] Inventor: Igor Antipov, Pleasant Valley, N.Y.

[73] Assignee: International Business Machines Corporation, Armonk, N.Y.

[21] Appl. No.: 48,561

[22] Filed: Jun. 14, 1979

[51] Int. Cl.³ .......................................... H01L 21/308
[52] U.S. Cl. ................................... 156/657; 156/643; 156/648; 156/649; 156/662; 427/93; 427/95; 427/399
[58] Field of Search ............... 156/628, 653, 648, 649, 156/657, 662; 357/49; 427/93, 399, 95

[56] References Cited

U.S. PATENT DOCUMENTS

| | | | |
|---|---|---|---|
| 3,966,577 | 6/1976 | Hochberg | 204/192 E |
| 3,969,168 | 7/1976 | Kuhn | 156/657 |
| 4,044,452 | 8/1977 | Abbas et al. | 357/49 |
| 4,104,086 | 8/1978 | Bondur et al. | 156/657 |
| 4,104,090 | 8/1978 | Pogge | 156/656 |
| 4,139,442 | 2/1979 | Bondur et al. | 357/49 |
| 4,160,991 | 7/1979 | Anantha et al. | 357/49 |

OTHER PUBLICATIONS

Jones et al., "A Composite ... Isolation", *Electrochemical Technology*, vol. 5, No. 5-6, (6/67), pp. 308-310.
Anantha et al., "Method of Making 1/N Cell", *IBM Technical Disclosure Bulletin*, vol. 21, No. 2 (7/78), pp. 601-602.
Abbas, "Recessed Oxide ... Process", *IBM Technical Disclosure Bulletin*, vol. 20, No. 1, (6/77), pp. 144-145.

*Primary Examiner*—Jerome W. Massie
*Attorney, Agent, or Firm*—Robert J. Haase

[57] ABSTRACT

A method for making both shallow and deep recessed oxide isolation trenches in silicon semiconductor substrates. A semiconductor substrate is reactively ion etched through mask apertures defining the deep trench areas and at least the perimeters of the shallow trench areas, the etched trenches are oxidized and partially filled with chemical-vapor-deposited (CVD) oxide. The filling of the trenches is completed with polycrystalline silicon. The excess polycrystalline silicon covering substrate areas other than the deep trench areas is removed down to the underlying CVD oxide.

The shallow trench areas are etched next, some of the shallow trench areas connecting with the upper regions of the deep trench areas. The monocrystalline and polycrystalline silicon in the respective shallow trench areas are removed and the remaining silicon is thermally oxidized.

4 Claims, 4 Drawing Figures

POLYCRYSTALLINE SILICON OXIDATION METHOD FOR MAKING SHALLOW AND DEEP ISOLATION TRENCHES

FIELD OF THE INVENTION

The invention generally relates to methods for making recessed oxide isolation trenches in semiconductor material for isolating regions of the material from each other.

DESCRIPTION OF THE PRIOR ART

Integrated circuit fabrication usually requires that the individual active and passive circuit elements be electrically isolated from each other in the common semiconductor chip so that desired circuit connections can be made by patterned surface metallization with which the isolated circuit elements are in contact. Many diverse techniques have been proposed, ranging from junction isolation to dielectric isolation, and to combinations thereof, to accomplish the desired isolation. An extensive citation of prior isolation techniques is given in U.S. Pat. No. 4,104,086, issued on Aug. 1, 1978 in the names of James Bondur and Hans Pogge for "Method For Forming Isolated Regions of Silicon Utilizing Reactive Ion Etching" and assigned to the present assignee. U.S. Pat. No. 4,104,086, among other things, cites: (1) U.S. Pat. No. 3,966,577, issued to Arthur Hochberg on June 29, 1976, which discloses a sputter etching method to achieve dielectric isolation using grown or deposited silicon dioxide to fill etched grooves; (2) S. A. Abbas, IBM Technical Disclosure Bulletin, Vol. 20, No. 1, p. 144, June 1977, entitled "Recessed Oxide Isolation Process" which describes a reactive ion etching method to make recessed silicon dioxide filled trenches by partially filling the trenches with evaporated polysilicon material and then oxidizing the material and (3) the paper "A Composite Insulator-Junction Isolation" by R. E. Jones and V. Y. Doo, published in Electrochemical Technology, Vol. 5, No. 5-6, May-June 1967, pages 308-310, which teaches a selective epi process for providing recesses between epi mesas which recesses are filled with oxide and polycrystalline silicon material.

U.S. Pat. No. 4,104,086 itself deals with the problem of avoiding incomplete filling of the isolation trenches with CVD oxide, manifested by an opening or poor quality dielectric region in the center of the CVD filled trenches. The cited problem is avoided by use of tapered walls in the trenches prior to CVD oxide filling. The tapering of the trench walls, however, reduces somewhat device density as a consequence of the corresponding increase in thickness of the CVD oxide-filled trenches at the surface of the semiconductor substrate.

Yet another U.S. Pat. No. 4,139,442, issued on Feb. 13, 1979 to James Bondur and Hans Pogge for "Reactive Ion Etching Method For Producing Deep Dielectric Isolation In Silicon" and assigned to the present assignee, teaches a method for simultaneously making both shallow and deep recessed oxide isolation trenches of equal narrow width where all trenches are filled in simultaneously by thermal oxidation of the vertical walls of the trenches.

SUMMARY OF THE INVENTION

Both shallow and deep recessed oxide isolation trenches are formed in silicon semiconductor substrates partly using a CVD oxide deposition process and partly using a polycrystalline silicon deposition and oxidation process which avoids openings or poor quality dielectric regions in the centers of the filled deep trenches while also avoiding the requirement that the trenches be completely filled by a high temperature process step such as a thermal oxidation step. The shallow trenches may be either narrow or wide but the deep trenches should be narrow so that the deep trenches are filled by a CVD oxide and polycrystalline silicon build-up on the vertical walls of the trenches.

The process comprises reactively ion etching a semiconductor substrate through mask apertures defining narrow, deep trench areas and defining the perimeters of wide, deep trench areas, oxidizing and partially refilling the etched trenches with chemical-vapor-deposited (CVD) oxide, and then completing the filling of the trenches with polycrystalline silicon. The excess polycrystalline silicon covering substrate areas other than the deep trench areas is removed down to the underlying CVD oxide.

The shallow trench areas are etched next, some of the shallow trench areas connecting with the upper regions of the narrow deep trench areas and others of the shallow, trench areas lying inside the perimeters of the wide, deep trench areas. The monocrystalline and polycrystalline silicon in the respective shallow trench areas are removed and the remaining silicon is thermally oxidized.

DESCRIPTION OF THE PREFERRED EMBODIMENTS

Figure 1:
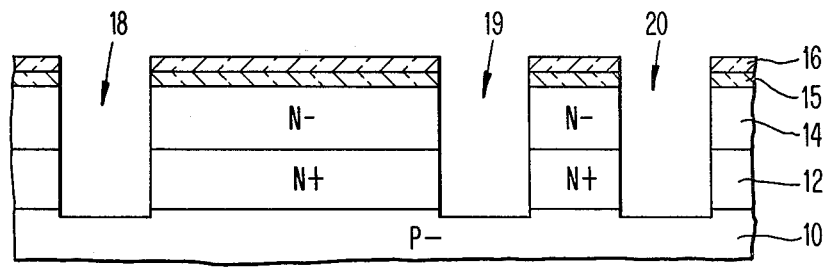
FIGS. 1, 2, 3 and 4 are simplified cross-sectional views of the structure obtaining at successive times during the fabrication of shallow and deep recessed oxide isolation trenches formed in silicon semiconductor substrates in accordance with the process of the present invention.

The structure of FIG. 1 includes monocrystalline silicon substrate 10 which is shown as P− conductivity for illustration purposes, an N+ layer 12 over the substrate 10 and an N− conductivity layer 14 on the layer 12. For the purposes of the invention, either all or some of the layers 10, 12 and 14 could be of opposite conductivity type from the conductivity types indicated. However, it is preferred that layer 12 be of high conductivity where it later becomes the collector of a bipolar transistor.

The structure of FIG. 1 can be fabricated by various techniques. The preferred technique, however, is to provide a P− monocrystalline silicon substrate 10 and to diffuse an N+ blanket diffusion into the substrate (to produce region 12) by using conventional diffusion or ion implantation of an N-type impurity such as arsenic, antimony or phosphorous to produce an N+ region with a surface concentration of between about $1 \times 10^{19}$ or $1 \times 10^{21}$ atoms/cc. The layer 14 is subsequently grown over layer 12 by means of epitaxial growth. This may be done by conventional techniques such as by the use of Si $Cl_4/H_2$ or Si $H_4/H_2$ mixtures at growth temperatures of about 1,000° C. to 1,200° C. The N+ layer may have a typical thickness of between 1-3 microns whereas the epitaxial layer may have a thickness of from 0.5 to 10 microns, the exact thicknesses depending upon the device to be built.

Alternatively, the structure could be made by various combinations of thermal diffusion, ion implantation and/or epitaxial growth which would include the formation of a buried subcollector region where subsequent formation of bipolar devices is desired.

In certain device structures, buried highly doped regions or layers are not necessary and can therefore be omitted. This is true for FET type devices. Alternatively, multiple buried highly doped regions of different dopant types could be formed by multiple epitaxial and diffusion processing. These structures could be needed for buried subcollectors, as well as for buried conductor lines.

The silicon structure comprising substrate 10, N+ layer 12 and N− layer 14 is oxidized to produce silicon dioxide layer 15 which then is covered by deposited silicon nitride layer 16. Layer 15 preferably is formed by the conventional technique of either thermal growth at a temperature of 970° C. in a wet or dry oxygen ambient or by chemical vapor deposition. Openings are formed in the nitride and oxide layers 16 and 15 respectively, in the trench areas 18 where relatively narrow, deep trench recessed oxide isolation is desired as well as in areas 19 and 20 which define the perimeters of the areas where relatively wide trench recessed oxide isolation is desired. The silicon within areas 18, 19 and 20 of layers 14 and 12 is reactively ion etched to yield the trench 18 structure shown in FIG. 1.

The purpose of the relatively narrow, deep trench recessed oxide isolation (to be formed within trench area 18) is to surround and, thus, electrically isolate pockets of the N− and N+ layers 14 and 12, respectively, in which active and passive semiconductor devices may be formed, as is well understood in the art. Accordingly, the trenches at 18 desirably are narrow so as to maximize the density of the isolated semiconductor components per unit of substrate surface area. The trenches at areas 18 also must be deep enough to reach P− substrate 10 so as to electrically isolate the adjacent portions of N− layer 14 from each other and to electrically isolate the adjacent portions of N+ layer 12 from each other whereby the desired pocket isolation is achieved.

As is well understood in the art, the formation of a P+ region underneath the isolation region 18 may be useful when the substrate is P+. In such cases, the P− region has a tendency to change its resistivity, even to the extent of inverting to N-type material, when it is thermally oxidized. A P+ implant (not shown) in substrate 10 directly underneath isolation region 18 prevents such inversion possibility. This may be formed by use of a P+ ion implantation of a dopant such as boron immediately after the trench at area 18 is oxidized as will be described later.

The purpose of the relatively wide trench recessed oxide isolation to be formed between areas 19 and 20 is to allow electrical surface conductors, such as patterned metallization (not shown) to be routed over the wide trench recessed oxide isolation with minimum capacitive coupling of the signals carried by the surface conductors to the underlying silicon substrate. Accordingly, it is desirable that the wide trench formed between areas 19 and 20 be as deep as the narrow trench formed at areas 18 so as to reduce the afore-described unwanted capacitive coupling to a minimum.

In accordance with the method of the present invention, a compromise is made between the depth of the ideally desired wide trench on the one hand, and the practical realities of fabrication technology, on the other hand. More particularly, the desired wide trench area is subdivided into a plurality of narrow, deep trenches (such as shown at 19 and 20) having the same dimensions as narrow trench 18. Only two trenches 19 and 20 are shown, for purposes of exemplification, but it should be understood that additional trenches similar to trenches 19 and 20 may be provided for wide trenches of increased width dimension. As will be seen more fully later, each of the deep trenches are filled by CVD oxide and polycrystalline silicon which deposit on the vertical walls as well as on the horizontal bottom surface of each of the narrow trenches. Thus, each of the narrow trenches is filled at the upper portions thereof, adjacent the silicon dioxide and silicon nitride layers 15 and 16, respectively, by deposits built up on the vertical walls of the narrow trenches. For this reason, it is necessary to deposit a combined thickness of CVD oxide and polycrystalline silicon approximately equal to only half the width of the narrow trenches (each trench having a typical width of approximately 2.5 microns or less). This is distinguished from the filling of a single, wide, deep trench which would require much thicker deposits because such a trench is filled upwards from the bottom rather than inwards from the sidewalls. The intermediate structure of FIG. 1 is processed further as follows. The structure is thermally oxidized to grow a silicon dioxide layer (not shown) having a thickness of approximately 1,000 Å. The previously mentioned P+ implant may be carried out, if desired, at this point to avoid any tendency of the N-type material underneath isolation region 18 to invert.

Figure 2:
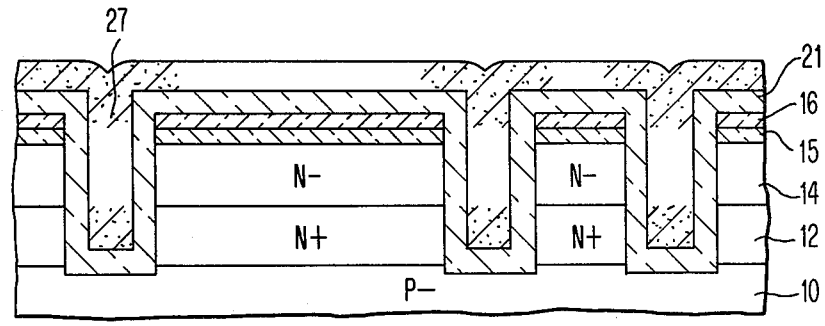

After oxidation, CVD oxide layer 21 is deposited to partially fill the narrow trenches. Layer 21 preferably is of a thickness of approximately 4,000 Å to 10,000 Å. The filling of the deep, narrow trenches is completed by the deposition of polycrystalline silicon layer 27 which also deposits over the surface of the CVD oxide layer 21 to yield the structure shown in FIG. 2. A suitable polycrystalline deposition method is described in the paper "Low Pressure CVD Production Processes for Poly, Nitride, and Oxide", by R. S. Rosler, Solid State Technology, April 1977, Vol. 20, pages 63–70.

Figure 3:
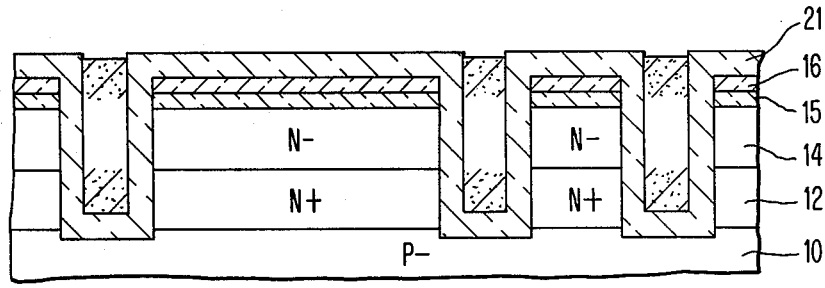

Polysilicon layer 27 is reactively ion etched down to the surface of CVD oxide layer 21, as shown in FIG. 3. The CVD oxide layer 21 prevents exposure of the trench boundaries in the event that the polysilicon layer 27 is over-etched during the reactive ion etching process. If desired, the CVD oxide layer 21 overlying the nitride layer 16 also may be removed by reactive ion or wet etching.

All shallow trench areas are formed next by first selectively removing CVD oxide 21, silicon nitride 16 and oxide 15 at the desired locations by appropriate masking and reactive ion etching in a conventional manner. Shallow trenches typically are formed within isolated pockets, where recessed oxide isolation is not desired to penetrate through N+ layer 12 such as, for example, where N+ layer 12 later becomes the subcollector of a transistor formed within an isolated pocket and the shallow recessed oxide isolation trench separates the collector reach-through from the base and emitter regions of the transistor (not shown) formed in the isolated pocket. In accordance with the present invention, however, shallow recessed oxide isolation trenches also are formed within the wide trench areas between the deep trenches such as trenches 19 and 20.

Figure 4:
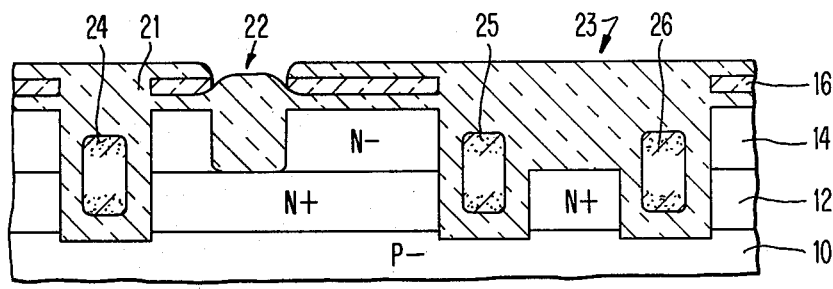

In general, the wide trench areas are formed by as many deep trenches as masking and etching techniques will allow which are later connected to each other at the top (adjacent silicon nitride and oxide layer 16 and 15, respectively) by bridging provided by shallow trenches. Accordingly, shallow trenches are etched through layers 21, 16 and 15 and into N⁻ layer 14 at locations 22 and 23 as shown in FIG. 4.

Additionally, shallow trenches are etched into the tops of the polycrystalline silicon filling within deep trenches 18, 19 and 20 so that better coplanarity is achieved in the next following oxidation step.

After the shallow trenches are etched, the resulting structure is thermally oxidized to convert the exposed polycrystalline silicon in deep trenches 18, 19 and 20 and to convert the exposed monocrystalline silicon (N⁻ layer) in shallow trenches 22 and 23 to silicon dioxide. The thermal oxidation converts at least the top portion of the polycrystalline silicon in deep trenches 18, 19 and 20 into thermal oxide approximately as thick as the thermal oxide formed in shallow trenches 22 and 23 thereby eliminating any "weak spots" that might have formed near the center of the polycrystalline silicon filled deep trenches 18, 19 and 20 at the conclusion of the polycrystalline silicon deposition step. It is not necessary that the thermal oxidation be continued to completely convert all of the polycrystalline silicon within deep trenches 18, 19 and 20 into silicon dioxide. Any residual polycrystalline silicon that might remain after oxidation, such as within regions 24, 25 and 26, are completely surrounded by a protective combination of CVD oxide 21 and thermally grown silicon dioxide.

Having thus described my invention, what I claim as new, and desired to secure by Letters Patent is:

1. The method for forming narrow, deep, recessed oxide isolation filled trenches and wide, deep recessed oxide isolation filled trenches in a monocrystalline silicon substrate comprising:
   etching said substrate through mask apertures in a masking layer defining said narrow trenches and the perimeters of said wide trenches,
   thermally oxidizing the surfaces of said trenches,
   partially filling said trenches with a dielectric material,
   completing the filling of said trenches with polycrystalline silicon,
   etching said substrate through mask apertures in the masking layer defining shallow trenches, some of said shallow trenches coinciding with the upper regions of said filled deep trenches and others of said shallow trenches bridging between said filled deep trenches, and thermally oxidizing the remaining polycrystalline silicon in said deep trenches and the monocrystalline silicone in said shallow trenches.

2. The method defined in claim 1 and further including removing said polycrystalline silicon covering substrate areas other than said deep trench areas prior to etching said substrate through mask apertures defining said shallow trenches.

3. The method defined in claim 1 wherein said dielectric material comprises chemical vapor deposited silicon dioxide.

4. The method defined in claim 1 wherein said masking layer comprises a layer of silicon dioxide covered by a layer silicon nitride.

* * * * *